(12) United States Patent
Shi et al.

(10) Patent No.: US 10,120,215 B2
(45) Date of Patent: Nov. 6, 2018

(54) APPARATUS FOR CARRYING SUBSTRATE BY OFF-LINE VACUUM SUCTION AND METHOD FOR TRANSPORTING SUBSTRATE

(71) Applicants: BOE Technology Group Co., Ltd., Beijing (CN); Hefei BOE Optoelectronics Technology Co., Ltd., Anhui (CN)

(72) Inventors: Xu Shi, Beijing (CN); Zhilong Xu, Beijing (CN); Jun Liu, Beijing (CN); Xiaojun Wang, Beijing (CN); Dongqing Li, Beijing (CN); Shutong Huang, Beijing (CN); Wei Chen, Beijing (CN); Lei Zhang, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/517,660

(22) PCT Filed: Oct. 15, 2015

(86) PCT No.: PCT/CN2015/091971
§ 371 (c)(1),
(2) Date: Apr. 7, 2017

(87) PCT Pub. No.: WO2016/206238
PCT Pub. Date: Dec. 29, 2016

(65) Prior Publication Data
US 2017/0307912 A1 Oct. 26, 2017

(30) Foreign Application Priority Data

Jun. 24, 2015 (CN) .......................... 2015 1 0355093

(51) Int. Cl.
*G02F 1/13* (2006.01)
*H01L 21/683* (2006.01)
(Continued)

(52) U.S. Cl.
CPC ............... *G02F 1/13* (2013.01); *B65G 47/91* (2013.01); *B65G 49/061* (2013.01);
(Continued)

(58) Field of Classification Search
CPC . Y10S 901/30; B25J 15/0014; B25J 15/0095; H01L 21/67706; H01L 21/67712;
(Continued)

(56) References Cited

U.S. PATENT DOCUMENTS 6,439,631 B1 * 8/2002 Kress .................. B65G 47/918
294/65
7,390,040 B2 * 6/2008 Subotincic ........... B25J 15/0052
198/468.3
(Continued)

FOREIGN PATENT DOCUMENTS

CN 1583221 A 2/2005
CN 202481753 U 10/2012
(Continued)

OTHER PUBLICATIONS

First Office Action for Chinese Patent Application No. 201510355093.4, dated May 22, 2017, 13 pages.
(Continued)

*Primary Examiner* — Stephen A Vu
(74) *Attorney, Agent, or Firm* — Westman, Champlin & Koehler, P.A.

(57) ABSTRACT

Embodiments of the present application provide an apparatus for carrying a substrate by an off-line vacuum suction and a method for transporting a substrate. The apparatus includes a carrying frame provided with a clamper, a
(Continued)

vacuum suction device and a detaching device arranged on the carrying frame, wherein the vacuum suction device is arranged to suck and fix a substrate and is connectable to and detachable from a vacuum pipeline and the detaching device is arranged to detach the vacuum suction device and the vacuum pipeline from each other while keeping the vacuum suction device to continuously suck the substrate to be transported. The apparatus and the method can improve fixing of the substrate and achieve off-line suction to the substrate.

12 Claims, 5 Drawing Sheets

(51) Int. Cl.
    *B65G 47/91*     (2006.01)
    *B65G 49/06*     (2006.01)
    *H01L 21/673*     (2006.01)
    *H01L 21/687*     (2006.01)
    *H01L 21/677*     (2006.01)

(52) U.S. Cl.
    CPC ...... *H01L 21/67346* (2013.01); *H01L 21/683* (2013.01); *H01L 21/6838* (2013.01); *H01L 21/68728* (2013.01); *B65G 2249/045* (2013.01); *G02F 1/1303* (2013.01); *H01L 21/67721* (2013.01)

(58) Field of Classification Search
    CPC ............. H01L 21/67742; H01L 21/683; H01L 21/67346; H01L 21/6838; H01L 21/68728; H01L 21/67721; G02F 1/13; G02F 1/1303; B65G 47/91; B65G 49/061; B65G 2249/045
    USPC .......................................................... 294/65
    See application file for complete search history.

(56) References Cited

U.S. PATENT DOCUMENTS

| | | | |
|---|---|---|---|
| 7,665,783 B2 | 2/2010 | Nishio | |
| 8,545,601 B2 | 10/2013 | Song | |
| 2001/0045755 A1* | 11/2001 | Schick | ...................... B25J 15/06 294/65 |
| 2008/0000756 A1* | 1/2008 | Behnke | ................. B65G 47/918 198/468.4 |
| 2008/0111388 A1* | 5/2008 | Kniss | .................... B25J 15/0052 294/65 |

FOREIGN PATENT DOCUMENTS

| | | |
|---|---|---|
| CN | 103560104 A | 2/2014 |
| CN | 104139946 A | 11/2014 |
| KR | 10-2011-0044469 A | 4/2011 |
| KR | 10-2011-0055098 A | 5/2011 |
| KR | 10-2012-0093705 A | 8/2012 |
| KR | 101276064 B1 | 6/2013 |
| TW | 200529997 A | 9/2005 |

OTHER PUBLICATIONS

International Search Report and Written Opinion of International Application No. PCT/CN2015/091971, dated Apr. 1, 2016, 7 pages.
English translation of Box No. V of the Written Opinion for the International Searching Authority for International Application No. PCT/CN2015/091971, 2 pages.

* cited by examiner (the Prior Art)

APPARATUS FOR CARRYING SUBSTRATE BY OFF-LINE VACUUM SUCTION AND METHOD FOR TRANSPORTING SUBSTRATE

CROSS-REFERENCE TO RELATED APPLICATION

This application is a 371 National Stage Application of International Application No. PCT/CN2015/091971, filed on 15 Oct. 2015, which published as WO 2016/206238 A1 on 29 Dec. 2016, which claims priority to Chinese Patent Application No. 201510355093.4, filed with SIPO on 24 Jun. 2015, which are incorporated herein by reference in their entirety.

BACKGROUND OF THE DISCLOSURE

Field of the Disclosure

The present disclosure relates to the technical field of display design and manufacturing, and in particular, to an apparatus for carrying a substrate by an off-line vacuum suction and a method for transporting a substrate.

Description of the Related Art

At present, as shown in FIG. 1, a substrate 5' needs to be treated by various processes during manufacturing a liquid crystal display, for example, sputtering various ions to a surface of the substrate 5'. During sputtering, the substrate 5' needs to keep straight and move. During the conventional process for moving the substrate 5', the substrate 5' is clamped and fixed by a clamping mechanism to keep the substrate 5' straight, and then the substrate 5' is moved by a traveling mechanism. Although the clamping mechanism may keep the substrate 5' straight in traveling of the substrate 5', the clamping mechanism fixes the substrate 5' mainly by a clamper (such as a square clamper 12' and a triangular clamper 11'). There is a gap between the substrate 5' and the clamper, thus, a risk of the substrate 5' swaying and falling may occur when it moves.

SUMMARY

The present disclosure provides an apparatus for carrying a substrate by an off-line vacuum suction, comprising a carrying frame provided with a clamper, a vacuum suction device and a detaching device arranged on the carrying frame, wherein the vacuum suction device is arranged to suck and fix the substrate and is connectable to and detachable from a vacuum pipeline, and the detaching device is arranged to detach the vacuum suction device and the vacuum pipeline from each other while keeping the vacuum suction device to continuously suck the substrate to be transported.

In an embodiment, the vacuum suction device comprises a suction holder fixed on a side of the carrying frame and composed of a plurality of pipes in communication with each other, and a vacuum suction head in communication with the pipes is provided on the suction holder, the vacuum pipeline being communicated with the pipes.

In an embodiment, the vacuum suction head comprises a sucking disc and a gas suction duct, and the gas suction duct has one end in communication with the sucking disc and the other end in communication with the pipes.

In an embodiment, a plurality of the suction heads are provided on the suction holder, and the sucking discs of the plurality of the suction heads have suction faces located in a same plane and each of the suction faces is arranged in the carrying frame.

In an embodiment, the vacuum suction device comprises a vacuum plate fixed on a side of the carrying frame, the vacuum plate having a hollow cavity and a suction plane located in the carrying frame, and wherein a plurality of suction holes in communication with the hollow cavity are arranged on the suction plane, the vacuum pipeline being communicated with the hollow cavity.

In an embodiment, the plurality of suction holes are distributed uniformly on the suction plane.

In an embodiment, the detaching device comprises a first joint arranged on the vacuum suction device and a second joint arranged on the vacuum pipeline and cooperating with the first joint, the first joint being provided with a cut-off valve.

In an embodiment, the detaching device further comprises a gas cylinder connected to the second joint and the detaching device is arranged to switch between a connection state and a detaching state for the first joint and the second joint.

In an embodiment, a plurality of the clampers are provided in the apparatus and arranged in pairs on both sides of the carrying frame, and the clampers on a side of the carrying frame away from the vacuum suction device are movable to open and close.

An embodiment of the present application also provides a method for transporting a substrate, the method comprising steps of:

placing the substrate into a carrying frame and fixing the substrate by a clamper;

sucking and fixing the substrate by using a vacuum suction device;

detaching the vacuum suction device and a vacuum pipeline from each other by a detaching device while keeping the vacuum suction device to continuously suck the substrate to be transported.

BRIEF DESCRIPTION OF THE DRAWINGS

The advantages of the above and/or additional aspects of the present application will below become more explicit and understandable from the description of embodiments with reference to following drawings.

Figure 1:
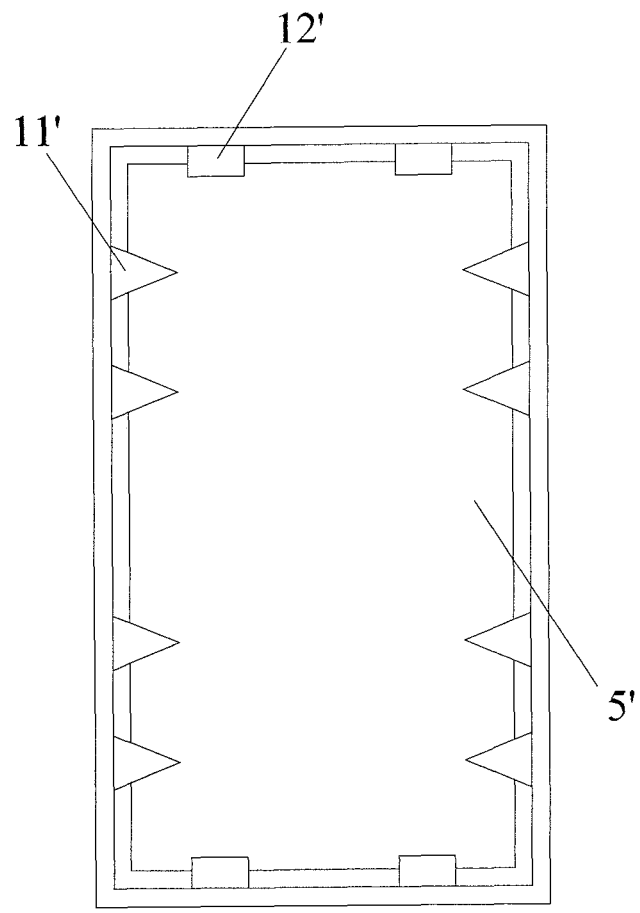
FIG. 1 is a schematic view showing a structure of the conventional carrying apparatus for transporting a substrate in the prior art.

The reference numerals for representing components in FIGS. 1-4 are listed as follow:

11': triangular clamper; 12': square clamper; 5': substrate; 1: carrying frame; 11: triangular clamper; 12: square clamper; 2: suction holder; 21: pipe; 22: vacuum suction head; 221: sucking disc; 222: gas suction duct;

223: suction face 3: vacuum plate; 31: suction hole; 4: vacuum pipeline; 5: substrate.

DETAILED DESCRIPTION OF PREFERRED EMBODIMENTS OF THE DISCLOSURE

In the description of the present application, it should be noted that the terms of "center", "longitudinal", "traverse", "up", "down", "front", "back", "left", "right", "vertical", "horizontal", "top", "bottom", "inner", "outer" or the like represent orientation and position relationship shown in drawings. It is only intended to describe the present disclosure easily and simplify the description, instead of representing the devices or elements must have special orientations, or be configured or operated by a special orientation. Thus, it should not be understood to limit the present invention. In addition, the terms of "first", "second" are only intended for convenient description, instead of being understood to represent or teach relative importance.

In the description of the present application, it should be noted that the terms of "mount", "connection" and "couple" should be understood widely, for example, may represent fixed connection, detachable connection, or integral connection, may represent mechanical connection, direct connection, or indirect connection by intermediate medium, or internal communication between two elements, unless it is explained otherwise. The skilled person in the art can understand the specific signification of the above terms in the present application. Further, in the description of the present application, "a plurality of" means two or more, unless it is explained otherwise.

In order that objects, technical solutions and advantages of the present disclosure may become more apparent, embodiments of the present application will be explained clearly and entirely below with reference to drawings. Apparently, the described embodiments are only a part of embodiments of the present application, instead of all of embodiments. All of other embodiments that can be envisaged by the skilled person in the art on the basis of the embodiments of the present application without any creative efforts fall within the scope of the present application.

An embodiment of the present application provides an apparatus for carrying a substrate by an off-line vacuum suction. It includes a carrying frame 1 provided with a clamper, a vacuum suction device and a detaching device arranged on the carrying frame 1. The vacuum suction device is arranged to suck and fix a substrate 5 and may be connected to a vacuum pipeline 4 and may be detached from the vacuum pipeline 4. The detaching device is arranged to detach the vacuum suction device and the vacuum pipeline 4 from each other while keeping the vacuum suction device to continuously suck the substrate 5 to be transported. The apparatus for carrying a substrate 5 by an off-line vacuum suction provided by the present application provides a vacuum suction device and a detaching device on a carrying frame 1 provided with a clamper. In this way, the substrate 5 is preliminarily fixed by a clamper at first and then is further fixed by the vacuum suction device such that it can be fixed more firmly, so as to solve the problem that the risk of the substrate 5 swaying and falling during straight transporting when the substrate 5 is fixed only by a clamping mechanism. Moreover, a detaching device is further provided, which can detach the vacuum suction device from a vacuum pipeline 4 for providing vacuum conditions for the vacuum suction device. And after the vacuum pipeline 4 is detached from the vacuum suction device, the vacuum suction device can suck the substrate 5 continuously, to achieve an off-line suction function. In this way, the vacuum pipeline 4 will not move along with the substrate 5, and thus the movement of the substrate 5 will not be affected by insufficient length of the vacuum pipeline 4 or the vacuum pipeline 4 wound or hooked on other devices.

Figure 2:
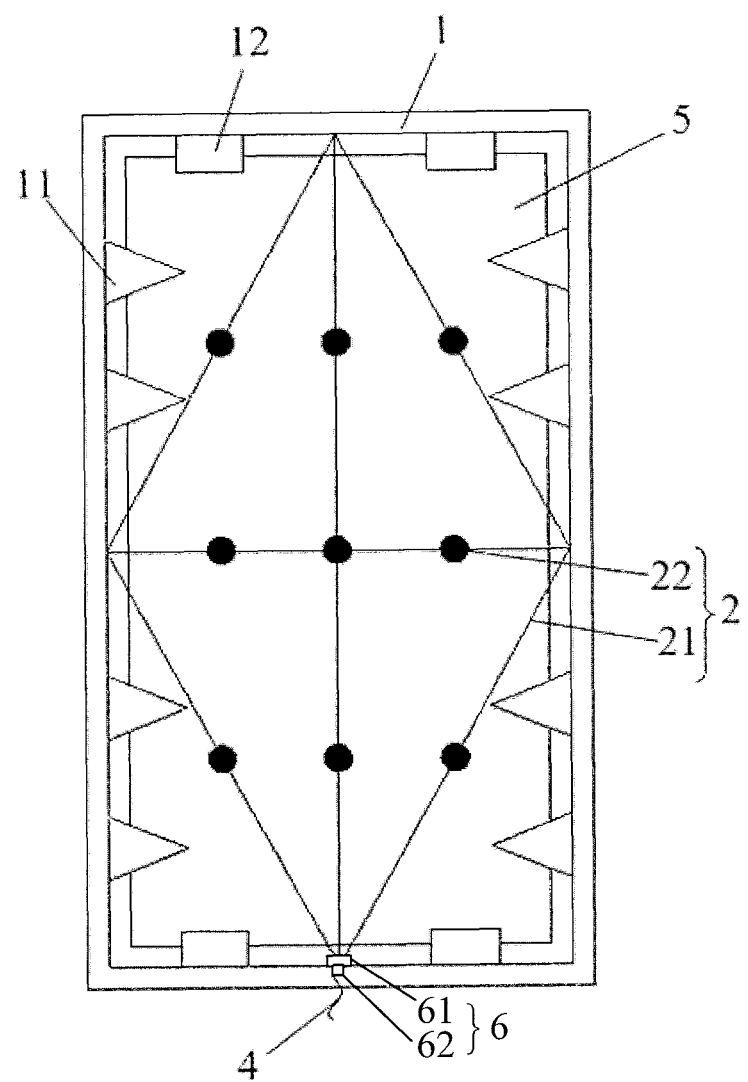
FIG. 2 is a schematic view showing an apparatus for carrying a substrate by an off-line vacuum suction according to an embodiment of the present application.

A plurality of embodiments of the present application will be explained below with reference to figures. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. As illustrated in FIG. 2, the present application provides an apparatus for carrying a substrate by an off-line vacuum suction. The apparatus includes a carrying frame 1 provided with a clamper, a vacuum suction device and a detaching device arranged on the carrying frame 1. The vacuum suction device comprises a suction holder 2 fixed on a side of the carrying frame 1 and composed of a plurality of pipes 21 in communication with each other, and a vacuum suction head 22 in communication with the pipes 21 is provided on the suction holder 2. As an example, a plurality of the suction heads 22 are provided on the suction holder 2 (at least one vacuum suction head 22 is arranged in each of the pipes 21 of the suction holder 2). The plurality of vacuum suction heads 22 are distributed uniformly on the suction holder 2. In this way, the vacuum suction heads 22 apply more uniform suction force to the substrate 5 and provide an improved suction effect while the substrate 5 can be prevented from being deformed due to application of non-uniform forces. The substrate 5 is placed into the carrying frame 1 from the other side of the carrying frame 1 and then is clamped and fixed by the clamper.

Figure 3:
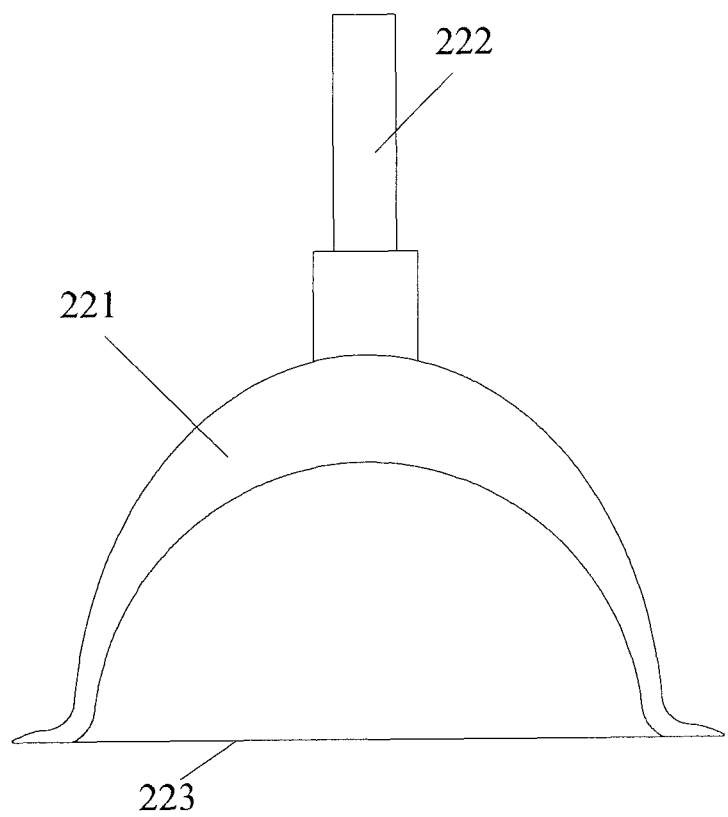
FIG. 3 is a schematic view showing a structure of a vacuum suction head in an embodiment of the present application.

In an example, as shown in FIG. 3, the vacuum suction head 22 includes a sucking disc 221 and a gas suction duct 222. The gas suction duct 222 has one end in communication with the sucking disc 221 and the other end in communication with the pipes 21. The sucking disc 221 is a semi-spherical rubber sucking disc 221. The sucking discs 221 of the plurality of the suction heads 22 have suction faces 223 located in the same plane, and each of the suction faces 223 is arranged in the carrying frame 1 so as to ensure the substrate 5 to be sucked in the carrying frame 1. And since all of the suction faces 223 of the suction heads 22 are located in the same plane, seal between the vacuum suction heads 22 and the substrate 5 can be ensured when the vacuum suction heads 22 are sucked to the substrate 5, so as to provide basis for achieving off-line suction. Certainly, the above sucking discs are not limited to only rubber material, instead, other elastic materials such as resin, plastics, also may satisfy the requirements for seal suction of the above sucking discs 221.

As an example, the detaching device 60 comprises a first joint 61 arranged on the vacuum suction device and a second joint 62 arranged on the vacuum pipeline 4 and cooperating with the first joint 61. The pipes 21 on the suction holder 2 are in communication with the vacuum pipeline 4 through an intake pipe. The first joint 61 is arranged at an end of the intake pipe and the second joint 62 is arranged at an end of the vacuum pipeline 4. The vacuum pipeline 4 and the intake pipe are connected to each other by cooperation between the first joint 61 and the second joint 62. And the intake pipe is provided with a cut-off valve. Vacuum state may be ensured to remain all along within the pipes 21 of the suction holder 2 by the cutoff valve when the vacuum pipeline 4 is detached from the intake pipe, so as to achieve the off-line vacuum suction of the substrate 5. The vacuum pipeline 4 is communicated with a vacuum source (for example, a vacuum pump or a pipe of power plant). The pipes 21 on the suction holder 2 are vacuumized by the vacuum pump or other vacuum devices to finish the suction of the substrate 5. As an example, the cutoff valve may prevent the external gas from entering the pipes 21 on the suction holder 2 when the first joint is disconnected with the second joint. It should be noted that FIG. 2 only shows schematically exemplary positions of the detaching device 60, the first joint 61 and the second joint 62, but it does not means that the practical shapes and scales of the detaching device 60, the first joint 61 and the second joint 62 according to an embodiment of the present application coincide with those shown in FIG. 2.

In an example, the detaching device may further comprise a gas cylinder. The gas cylinder may be arranged on the carrying frame 1, or may be arranged on other positions. The gas cylinder is connected to the second joint and may switch between a connection state and a detaching state for the first joint and the second joint. That is, the gas cylinder supplies power for assembling and detaching of the first joint and the second joint, to avoid trouble of manual assembling and detaching. In this way, the operation becomes more convenient and easy. Certainly, in the above embodiments, the gas cylinder may be replaced by power devices such as a hydraulic cylinder, a drive motor and a worm and gear assembly. They also may provide power for assembling and detaching the first joint and the second joint.

In the above embodiments, the detaching device is not limited to only the above structure, for example, a three-way valve may be arranged on the intake pipe and the vacuum pipeline 4 is connected to a port of the three-way valve. It may also achieve the object of the present application without departing the technical concept of the present application and thus belongs to the protection scope of the present application.

In case that the three-way valve is arranged in the intake pipe, the means for vacuumizing the pipes are not limited to only the vacuum pump. The other means are also applicable. For example, one port of the three-way valve is connected to the intake pipe and the other two ports thereof are a CDA (abbreviation of clean dry air, i.e., clear dry compression air) gas input port and a CDA gas output port respectively. The pipes on the suction holder may be vacuumized by the CDA gas flowing between the input port and the output port. Until that time, the cutoff valve is not closed. It may also achieve the object of off-line vacuum suction without departing the technical concept of the present application and thus belongs to the protection scope of the present application.

The carrying frame 1 is a hollow structure in a form of frame. A plurality of the clampers are provided on the carrying frame 1 and arranged in pairs on both sides of the carrying frame 1. The clampers on the side of the carrying frame away from the vacuum suction device are movable to open and close. The suction holder 2 is arranged on one side of the carrying frame 1 and the other side of the carrying frame 1 provides an opening through which the substrate 5 is put. The clampers may include square clampers 12 and triangular clampers 11. The square clampers 12 are arranged at inner sides of an upper border and a lower border of the carrying frame 1 and distributed uniformly in lengthwise directions of the upper and lower borders. The triangular clampers 11 are arranged at inner sides of a left border and a right border of the carrying frame 1 and distributed uniformly in lengthwise directions of the left and right borders. And the triangular clampers 11 and the square clampers 12 on the side of the carrying frame 1 away from the suction holder 2 are movable to open and close while the clampers on the other side are fixed. In this way, the clampers are opened when the substrate 5 is placed. After the substrate 5 is placed into the carrying frame, the clampers are closed to fix the substrate 5.

It should be noted that all of the clampers in the above embodiments may be the square clampers 12 or the triangular clampers 11. They may also achieve the function of fixing the substrate 5. And the clampers may also be configured such that they may be opened and closed on both sides of the carrying frame 1. It may also facilitate mounting the substrate 5.

Figure 5:
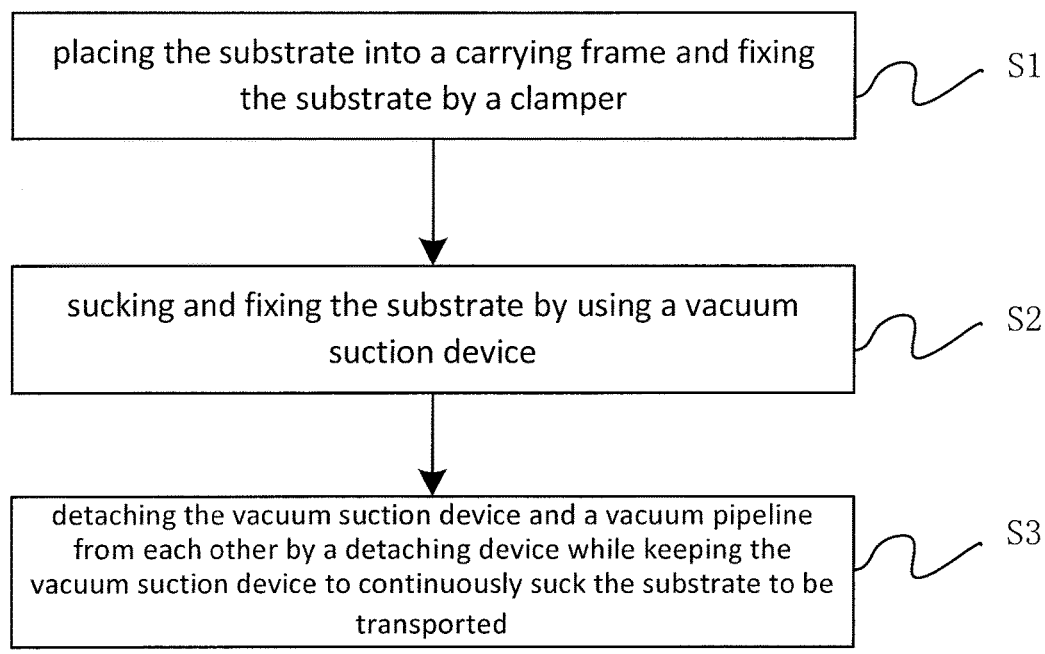
FIG. 5 shows a flow chart of a method for transporting a substrate according to an embodiment of the present application.

An embodiment of the present application also provides a method for transporting a substrate. As shown in FIG. 5, the method includes the following steps of:

S1: placing the substrate 5 into a carrying frame 1 and fixing the substrate 5 by a clamper;

S2: sucking and fixing the substrate 5 by using a vacuum suction device; and S3: detaching the vacuum suction device and a vacuum pipeline 4 from each other by a detaching device while keeping the vacuum suction device to continuously suck the substrate 5 to be transported.

The method for transporting the substrate 5 using the apparatus for carrying a substrate by an off-line vacuum suction in the embodiment will be further explained below.

At first, the clampers are opened and the substrate 5 is placed into the carrying frame 1, and the clampers are closed to finish preliminary fixing of the substrate 5. At that time, the substrate 5 (such as a glass substrate) is placed against the sucking discs 221. The first joint and the second joint are connected together by a gas cylinder. A vacuum pump and a cutoff valve are turned on so as to vacuumize the pipes 21 of the suction holder 2. At that time, the substrate 5 is sucked completely by the vacuum suction heads 22. Then the cutoff valve is turned off and the first joint and the second joint connected together are detached from each other by the gas cylinder. At that time, the vacuum is still kept in the pipes 21 and the substrate 5 is still sucked. At that time, the substrate 5 is moved by a traveling mechanism. The cutoff valve is not turned on until the substrate 5 moves to the prescribed position, so as to take the substrate 5 out to finish movement of the substrate 5 completely. As the vacuum suction heads 22 suck and fix the substrate 5 all along in an entire process, the substrate 5 may be fixed more firmly. Thus, it prevents the substrate 5 from swaying and falling when it moves, in comparison with the case that only the clamping devices are used. And the vacuum pipeline 4 will not move along with the substrate to achieve off-line vacuum suction.

Figure 4:
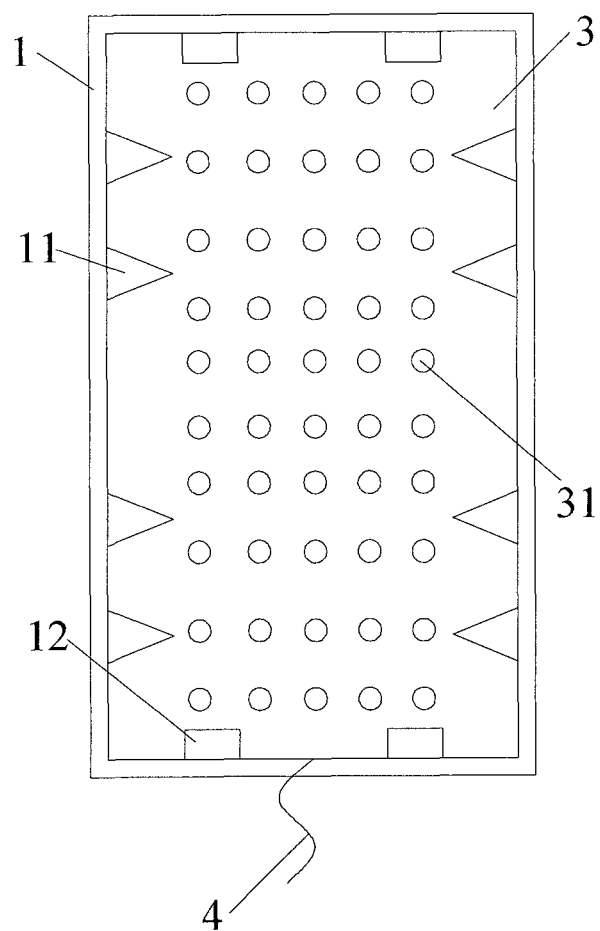
FIG. 4 is a schematic view showing an apparatus for carrying a substrate by an off-line vacuum suction according to an embodiment of the present application.

FIG. 4 shows another apparatus for carrying a substrate by an off-line vacuum suction according to an embodiment of the present application. It has the substantially same technical solution as that in the previous embodiment. It also includes the carrying frame 1 provided with clampers, the vacuum suction device and the detaching device arranged on the carrying frame 1. It is distinguished from the previous embodiment mainly in that the vacuum suction device comprises a vacuum plate 3 fixed on a side of the carrying frame 1, the vacuum plate 3 having a hollow cavity and a suction plane located in the carrying frame 1. A plurality of suction holes 31 in communication with the hollow cavity are arranged on the suction plane, and the vacuum pipeline 4 is communicated with the hollow cavity. And the plurality of suction holes 31 are distributed uniformly on the suction plane such that the suction force to the substrate 5 becomes more uniform and the substrate 5 is fixed more stably.

As an example, the carrying frame 1 is a box-like structure having an opening at one end. A plurality of the clampers are provided on the carrying frame 1 and arranged at an inner periphery on the side of the carrying frame 1 having the opening. The clampers are movable to open and close. The clampers are opened when the substrate 5 is placed. The clampers are closed after the substrate 5 is put into the carrying frame to finish preliminary fixing of the substrate 5. The clampers may include square clampers 12 and triangular clampers 11. The square clampers 12 are arranged at inner peripheries of an upper border and a lower border of the carrying frame 1 and distributed uniformly in lengthwise directions of the upper and lower borders. The triangular clampers 11 are arranged at inner peripheries of a left border and a right border of the carrying frame 1 and distributed uniformly in lengthwise directions of the left and right borders. And the vacuum plate forms the bottom of the box-like carrying frame 1 and the suction holes 31 are arranged within the box.

It should be understood that all of exemplary structures (such as the first joint 61, the second joint 62, the cutoff valve, the gas cylinder, the three-way valve) of the detaching device 60 as described above may be used in combination with the vacuum plate 3. The details will be omitted. The method for transporting the substrate 5 using the apparatus for carrying a substrate by an off-line vacuum suction in the embodiment will be further explained below.

At first, the clampers are opened and the substrate 5 is placed into the carrying frame 1, and the clampers are closed to finish preliminary fixing of the substrate 5. At that time, the substrate 5 (such as a glass substrate) is placed against the suction plane of the vacuum plate 3 and covers all of suction holes 31 completely. The first joint and the second joint are connected together by a gas cylinder. A vacuum pump and a cutoff valve are turned on so as to vacuumize the hollow cavity within the vacuum plate 3. At that time, the substrate 5 is sucked completely by the suction holes 31. Then the cutoff valve is turned off and the first joint and the second joint connected together are detached from each other by the gas cylinder. At that time, the vacuum is still kept in the hollow cavity within the vacuum plate 3 and the substrate 5 is still sucked. At that time, the substrate 5 is moved by a traveling mechanism. The cutoff valve is not turned on until the substrate 5 moves to the prescribed position, so as to take the substrate 5 out to finish movement of the substrate 5 completely. As the vacuum plate 3 sucks and fixes the substrate 5 all along in an entire process, the substrate 5 may be fixed more firmly. Thus, it prevents the substrate 5 from swaying and falling when it moves, in comparison with the case that only the clamping devices are used. And the vacuum pipeline 4 will not move along with the substrate to achieve off-line vacuum suction.

Embodiments of the present application may also provide a substrate carrying system including the apparatus for carrying a substrate by an off-line vacuum suction, a vacuum pipeline and a vacuum source.

As described above, the apparatus for carrying a substrate by an off-line vacuum suction provided by the present application provides a vacuum suction device and a detaching device on a carrying frame provided with a clamper. The substrate is preliminarily fixed by a clamper at first and then is further fixed by the vacuum suction device such that it can be fixed more firmly, so as to solve the problem that the risk of the substrate swaying and falling during straight transporting when the substrate is fixed only by a clamping mechanism. Moreover, a detaching device is further provided, which can detach the vacuum suction device from a vacuum pipeline for providing vacuum conditions for the vacuum suction device. And after the vacuum pipeline is detached from the vacuum suction device, the vacuum suction device can suck the substrate continuously, to achieve an off-line suction function. In this way, the vacuum pipeline will not move along with the substrate, and thus the movement of the substrate will not be affected by insufficient length of the vacuum pipeline or the vacuum pipeline wound or hooked on other devices.

Finally, it should be noted that the above embodiments are exemplary embodiments of the present application, instead of limiting the present application. Although the present application has been explained with reference to the above embodiments, the skilled person in the art should understand that the technical solutions disclosed in the above embodiments may be modified or part of technical features in these technical solutions may be replaced without departing from the principles and spirit of the disclosure.

What is claimed is:

1. An apparatus for carrying a substrate by an off-line vacuum suction, comprising a carrying frame provided with a clamper, a vacuum suction device and a detaching device arranged on the carrying frame, wherein the vacuum suction device is arranged to suck and fix the substrate and is connectable to and detachable from a vacuum pipeline, and the detaching device is arranged to detach the vacuum suction device and the vacuum pipeline from each other while keeping the vacuum suction device to continuously suck the substrate to be transported, wherein the vacuum suction device comprises a suction holder fixed on a side of the carrying frame and comprising a plurality of pipes in communication with each other, and a plurality of vacuum suction heads in communication with the pipes are provided on the suction holder, the vacuum pipeline being communicated with the pipes, and wherein the vacuum suction heads each comprise a sucking disc and a gas suction duct, and the gas suction duct has one end in communication with the sucking disc and the other end in communication with the pipes, and wherein the sucking discs of the plurality of the suction heads have suction faces located in a same plane and each of the suction faces is arranged in the carrying frame.

2. The apparatus according to claim 1, wherein a plurality of the clampers are provided in the apparatus and arranged in pairs on both sides of the carrying frame, and the clampers on a side of the carrying frame away from the vacuum suction device are movable to open and close.

3. The apparatus according to claim 1, wherein the sucking disc is a semi-spherical sucking disc.

4. The apparatus according to claim 1, wherein the detaching device comprises a first joint arranged on the vacuum suction device and a second joint arranged on the vacuum pipeline and cooperating with the first joint, the first joint being provided with a cut-off valve.

5. The apparatus according to claim 4, wherein the detaching device further comprises a gas cylinder connected to the second joint and the detaching device is arranged to switch between a connection state and a detaching state for the first joint and the second joint.

6. A method for transporting a substrate using the apparatus according to claim 1, the method comprising steps of:
placing the substrate into a carrying frame and fixing the substrate by a clamper;
sucking and fixing the substrate by using a vacuum suction device;

detaching the vacuum suction device and a vacuum pipeline from each other by a detaching device while keeping the vacuum suction device to continuously suck the substrate to be transported.

7. An apparatus for carrying a substrate by an off-line vacuum suction, comprising a carrying frame provided with a clamper, a vacuum suction device and a detaching device arranged on the carrying frame, wherein the vacuum suction device is arranged to suck and fix the substrate and is connectable to and detachable from a vacuum pipeline, and the detaching device is arranged to detach the vacuum suction device and the vacuum pipeline from each other while keeping the vacuum suction device to continuously suck the substrate to be transported, wherein the vacuum suction device comprises a vacuum plate fixed on a side of the carrying frame, the vacuum plate having a hollow cavity and a suction plane located in the carrying frame, and wherein a plurality of suction holes in communication with the hollow cavity are arranged on the suction plane, the vacuum pipeline being communicated with the hollow cavity.

8. The apparatus according to claim 7, wherein the plurality of suction holes are distributed uniformly on the suction plane.

9. The apparatus according to claim 8, wherein the detaching device comprises a first joint arranged on the vacuum suction device and a second joint arranged on the vacuum pipeline and cooperating with the first joint, the first joint being provided with a cut-off valve.

10. The apparatus according to claim 7, wherein the detaching device comprises a first joint arranged on the vacuum suction device and a second joint arranged on the vacuum pipeline and cooperating with the first joint, the first joint being provided with a cut-off valve.

11. An apparatus for carrying a substrate by an off-line vacuum suction, comprising a carrying frame provided with a clamper, a vacuum suction device and a detaching device arranged on the carrying frame, wherein the vacuum suction device is arranged to suck and fix the substrate and is connectable to and detachable from a vacuum pipeline, and the detaching device is arranged to detach the vacuum suction device and the vacuum pipeline from each other while keeping the vacuum suction device to continuously suck the substrate to be transported, wherein the detaching device comprises a first joint arranged on the vacuum suction device and a second joint arranged on the vacuum pipeline and cooperating with the first joint, the first joint being provided with a cut-off valve.

12. The apparatus according to claim 11, wherein the detaching device further comprises a gas cylinder connected to the second joint and the detaching device is arranged to switch between a connection state and a detaching state for the first joint and the second joint.

* * * * *